United States Patent [19]
Sur et al.

[11] Patent Number: 6,140,188
[45] Date of Patent: Oct. 31, 2000

[54] SEMICONDUCTOR DEVICE HAVING LOAD DEVICE WITH TRENCH ISOLATION REGION AND FABRICATION THEREOF

[75] Inventors: Harlan Sur, San Leandro; Subhas Bothra, San Jose, both of Calif.

[73] Assignee: Philips Semiconductors, Inc., Sunnyvale, Calif.

[21] Appl. No.: 09/083,251

[22] Filed: May 20, 1998

[51] Int. Cl.[7] .................................. H01L 21/336
[52] U.S. Cl. ..................... 438/294; 438/210; 438/238; 438/328; 438/330; 438/361; 438/382; 438/430; 257/508
[58] Field of Search ..................... 438/238, 248, 438/294, 361, 430, 210, 328, 330, 382; 364/468; 257/508

[56] References Cited

U.S. PATENT DOCUMENTS 5,854,114  12/1998  Li et al. .................................. 438/296
5,891,771   4/1999  Wu et al. ................................ 438/248
5,993,040  11/1999  Harlan Sur ............................. 364/468
6,008,082  12/1999  Rolfson et al. ........................ 438/238

OTHER PUBLICATIONS

Wolf, Silicon Processing for the VLSI Era, vol. 2: Process Integration, pp. 584–585, 641, Lattice Press.

*Primary Examiner*—Mary Wilczewski
*Assistant Examiner*—Calvin Lee
*Attorney, Agent, or Firm*—Peter Zawilski

[57] ABSTRACT

A small-area, high-resistance load device is fabricated in the same area used for the shallow trench isolation region. In an example embodiment, the load device comprises a series resistor coupled to a poly-silicon diode. In one example application, the load device acts as a pull-up device replacing standard PMOS pull-up loads used in connection with static memory cells, thereby increasing the cell density of a static memory array.

7 Claims, 9 Drawing Sheets

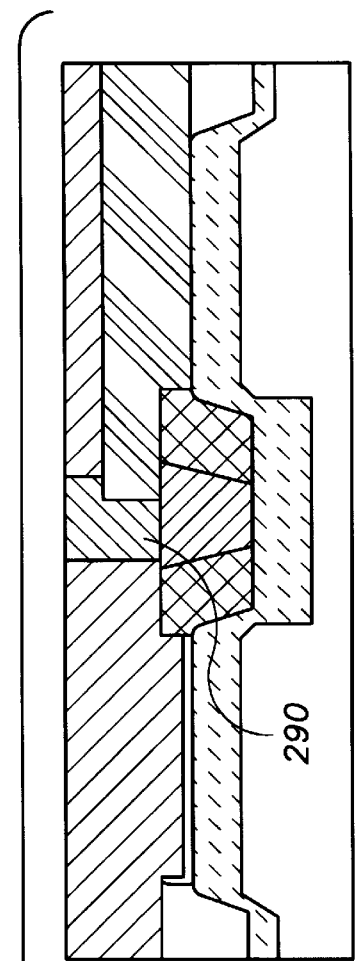
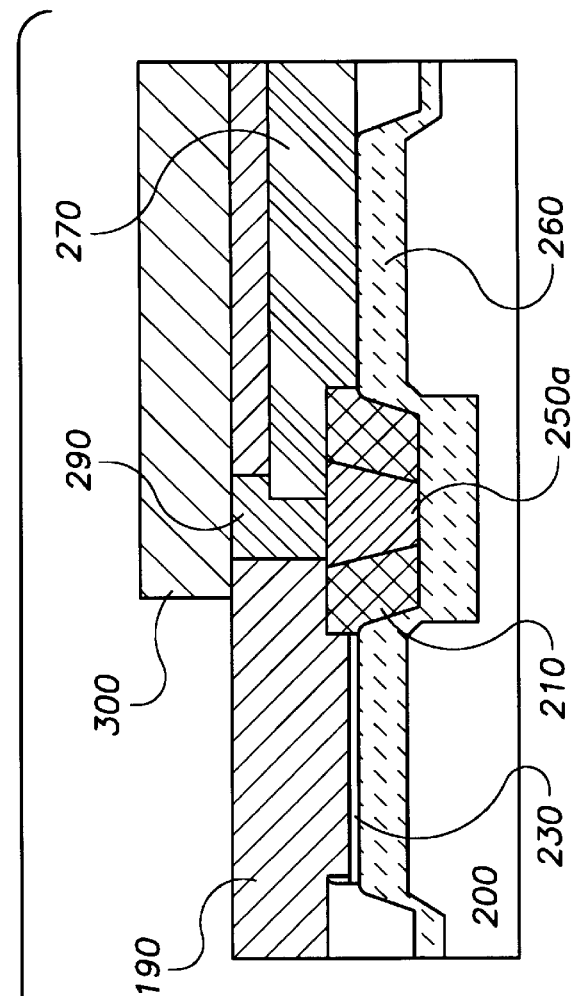
FIG.2l
FIG.2m

SEMICONDUCTOR DEVICE HAVING LOAD DEVICE WITH TRENCH ISOLATION REGION AND FABRICATION THEREOF

FIELD OF THE INVENTION

The present invention relates generally to semiconductor devices and semiconductor manufacturing and, more particularly, to semiconductor devices and their manufacture involving trench isolation (TI) and load devices.

BACKGROUND OF THE INVENTION

The electronics industry continues to rely upon advances in semiconductor technology to realize higher-functioning devices in more compact areas. For many applications, realizing higher-functioning devices requires integrating a large number of electronic devices into a single silicon wafer. As the number of electronic devices per given area of the silicon wafer increases, the manufacturing process becomes more difficult.

A large variety of semiconductor devices have been manufactured having various applications in numerous disciplines. Such silicon-based semiconductor devices often include metal-oxide-semiconductor (MOS) transistors, such as p-channel MOS (PMOS), n-channel MOS (NMOS) and complimentary MOS (CMOS) transistors, bipolar transistors, BiCMOS transistors, etc.

Each of these semiconductor devices generally include a semiconductor substrate on which a number of active devices are formed. The particular structure of a given active device can vary between device types. For example, in MOS transistors, an active device generally includes source and drain regions and a gate electrode which modulates current between the source and drain regions.

One important step in the manufacture of such devices is the formation of isolation areas to electrically separate electrical devices, or portions thereof, that are closely integrated in the silicon wafer. While the particular structure of a given active device can vary between device types, a MOS-type transistor generally includes source and drain regions and a gate electrode that modulates current flowing in a channel between the source and drain regions. Current should not flow between source and drain regions of adjacent MOS-type transistors. However, during the manufacturing process movement of dopant atoms, for example, of boron, phosphorus, arsenic or antimony, can occur within the solid silicon of the wafer. This movement is referred to as diffusion. The diffusion process occurs at elevated temperatures where there is a concentration gradient between dopant atoms external to the silicon wafer and dopant atoms diffusing into the silicon wafer and is typically employed when forming p-type and n-type regions of a silicon integrated circuit device.

A technique referred to as "trench isolation" has been used to limit such flow. A particular type of trench isolation is referred to as shallow trench isolation (STI). STI is often used to separate the respective diffusion regions of devices of the same polarity type (i.e., p-type versus n-type).

Another important step in the manufacture of such devices is the formation of load devices. Load devices are constructed to provide a selected degree of electrical resistance between two or more electrical components or regions. As an example, a terminal of an electrical component can be "pulled up" to a power source through a load device. Pulling up the component in this manner biases the component so that the voltage at its terminal follows the voltage of the power source in the absence of another force directing the terminal toward another voltage. In MOS-based circuits, load devices are commonly implemented using one or more PMOS or NMOS transistor, with the source-drain channel used to provide the resistance.

For many applications, using large-sized loads is desirable, because the size of the load is proportional to the amount of electrical resistance provided between the terminal and the power source. Using the example application above, a large-size load thereby permits a smaller force to direct the terminal of the electrical component toward the other voltage that is at a level different than the voltage level of the power source.

In many applications, STI regions and load devices consume a significant amount of real estate and are quite common. Consider, for example, a static memory access memory (SRAM) cell which uses multiple STI regions and load devices. Typically, an SRAM is implemented as an array including thousands of memory cells. The amount of real estate consumed by the STI regions and load devices through the SRAM array is quantified by multiplying the amount of real estate consumed in each cell by the total number of cells in the array.

With the demands for increasing the density of such MOS-based circuits continuing to escalate, there is an ongoing need to reduce the amount of real estate consumed by various aspects of the circuits, such as regions occupied by STI and load device structures.

SUMMARY OF THE INVENTION

The present invention is exemplified in a number of implementations, several of which are summarized below. According to one embodiment, a load device is fabricated by a series of steps including: providing a trench isolation ("TI") structure of certain depth with an opening therein, and defining a poly-silicon load area substantially contained with the TI structure and protruding above a portion of the TI structure. An upper portion of the opening of the TI structure is adjacent a nitride stop layer. The poly-silicon load area is chemical-mechanical polished (CMP) until the poly-silicon load area is substantially flush with the adjacent TI structure. The poly-silicon is then doped with positive carriers, and the nitride stop layer is removed. In one more particular embodiment, the TI structure is a shallow trench isolation structure.

The above summary of the present invention is not intended to describe each illustrated embodiment or every implementation of the present invention.

BRIEF DESCRIPTION OF THE DRAWINGS

The invention may be more completely understood in consideration of the following detailed description of various embodiments of the invention in connection with the accompanying drawings, in which:

FIGS. 2a through 2m illustrate cross-sectional views of an STI structure at various stages of a process, according to the present invention, that can be used to manufacture the structure of FIG. 1a.

Figure 1A:
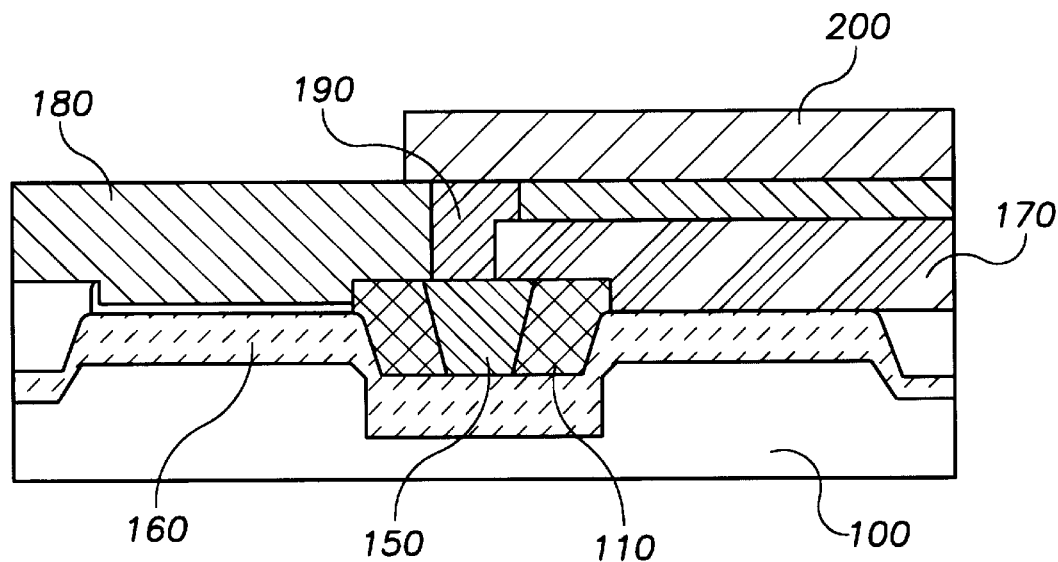
FIGS. 1a and 1b respectively show a cross-sectional view of a small area high-resistance load element integrated into an STI structure and its corresponding schematic diagram, according to an example embodiment of the present invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION OF THE VARIOUS EMBODIMENTS

The invention has been found to be particularly advantageous in applications where it is desirable to use a small-area, high-resistance load device near a diffusion isolation region separating MOS devices, such as a PMOS, NMOS, CMOS, or BiCMOS devices. While the present invention is not necessarily limited to this environment, an appreciation of various aspects of the invention is best gained through a discussion of example structures and processes used to form such semiconductor devices.

Turning now to the drawings, FIG. 1a depicts a cross-sectional view of an example semiconductor structure including a load device. The illustrated structure includes a P-substrate 100 and a p$^+$ poly-silicon region (or plug) 150 formed therein. According to one aspect of the invention, the plug 150 is formed by doping poly-silicon with a p$^+$ material within an STI oxide region 110.

Figure 1B:
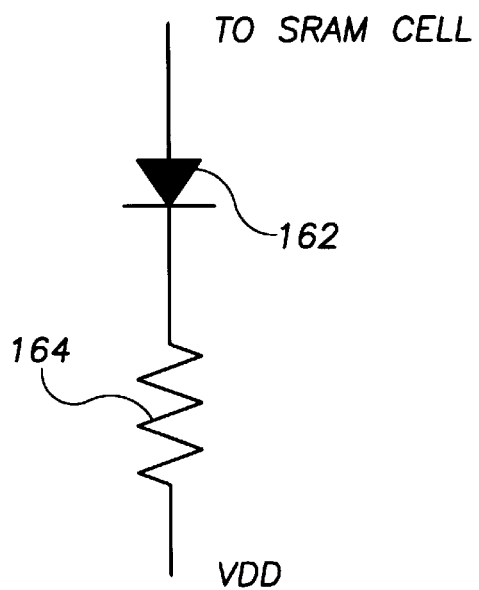

The plug 150 and an N-well region 160 form the circuit of FIG. 1b, including series-coupled diode 162 and resistor 164. The junction of the plug 150 and the N-well forms the diode 162. The resistor 164 corresponds to resistance provided by the diode structure and the N-well region 160.

A specific embodiment of the present invention is directed to an application of the illustrated load device in the context of a static random access memory (SRAM) cell. In FIG. 1a, a portion of such a cell is illustrated by way of a poly-silicon gate (poly-gate) 170. The poly-gate 170 is used to form the gate of an SRAM transistor (as is discussed in connection with FIGS. 3a–3c). The plug 150 is connected to the poly-gate 170. A dielectric (such as silicon dioxide) 180 is applied over the poly-gate 170 as well as other exposed areas of the STI structure. An opening is defined in the dielectric 180 to permit the formation of a contact 190 for electrical connection to the plug 150. In one embodiment, the contact 190 is implemented using tungsten. A metal layer 200 is then applied over the dielectric 180 and the contact 190 for integrating the SRAM transistor into the SRAM array.

In the load device, most of the resistance is due to the leakage current of the reversed-biased diode, and the remaining resistance is provided generally by the N-well. For a particular example SRAM load structure, the resistance ranges from $1\times10^{10}$ to $1\times10^{14}$ ohms.

FIGS. 2a–2m depict an example set of processing steps that may be used to build a combined STI CMOS structure, according to an example embodiment of the present invention.

Figure 2A:
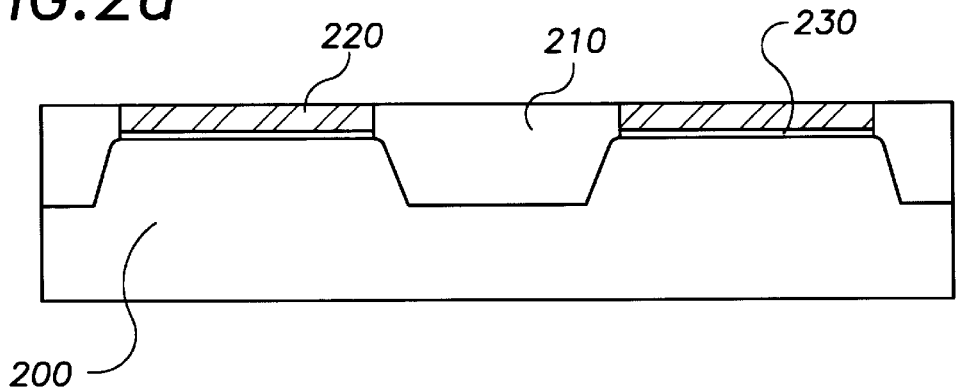

FIG. 2a shows a shallow trench isolation structure (STI) created by the example process. The example STI structure comprises a substrate of P-type silicon 200, an STI oxide 210, and a nitride layer 220 over an oxide 230.

Figure 2B:
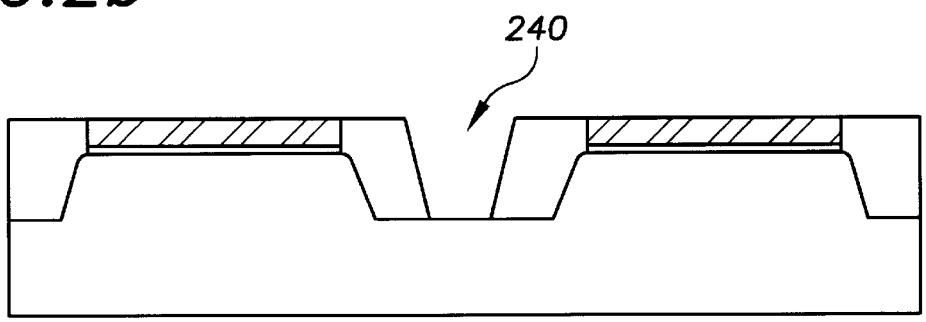

In FIG. 2b, the process includes forming an aperture 240 for subsequent definition of a load area.

Figure 2C:
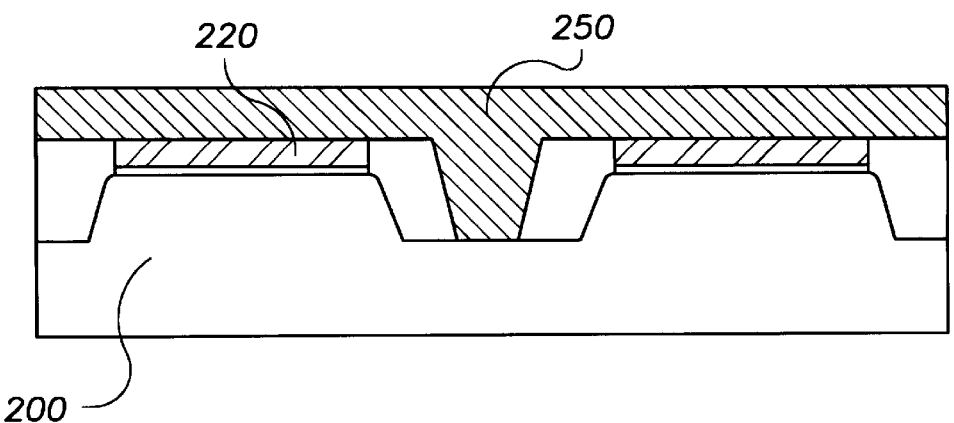
Figure 2D:
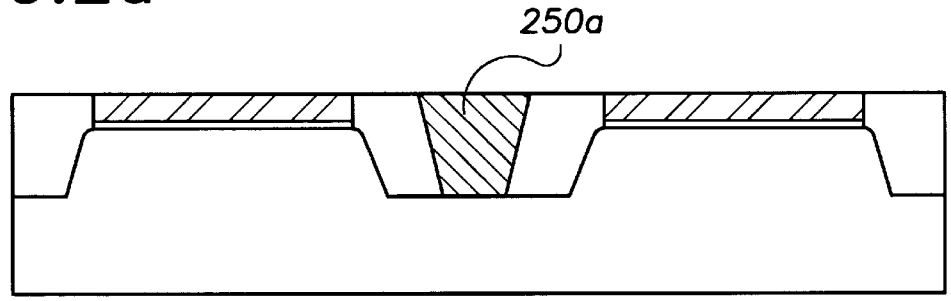

In FIGS. 2c and 2d, a poly-silicon or amorphous silicon 250 is deposited to fill in the aperture 240. As shown in FIG. 2d, the excess poly-silicon is removed using conventional techniques, such as through chemical mechanical polishing (CMP). The nitride layer 220, acts a stop layer to control the depth of the polishing. A poly-silicon plug 250a remains. The plug 250a is formed so that it is flush with the top surface of the STI structure.

Figure 2E:
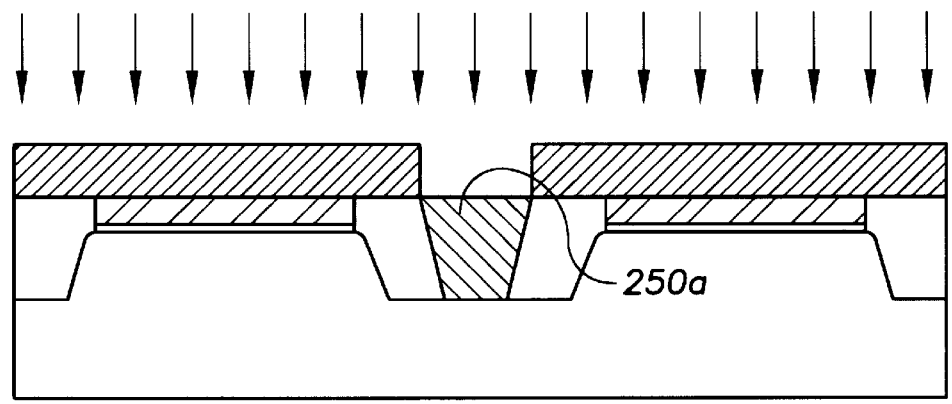

In FIG. 2e, the area surrounding the poly-silicon layer 250a is masked using conventional photolithography techniques and then implanted with boron so that the poly-silicon layer 250a is biased p$^+$.

Figure 2F:
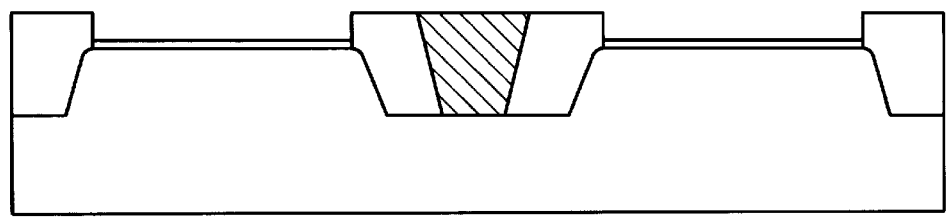

FIG. 2f depicts the STI structure after removing the nitride layer 220. The nitride layer 220 can be removed using conventional etching techniques.

Figure 2G:
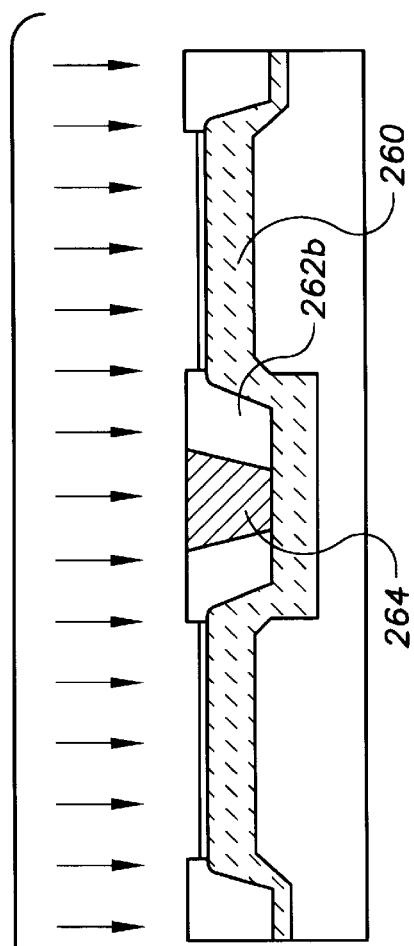

Referring now to FIG. 2g, after the nitride layer is removed, the STI structure undergoes the same processing as that of the corresponding CMOS structure. In this example embodiment, the N-wells of the CMOS structure are formed using a phosphorus implant. Application of the N-type dopant has sufficient energy for penetrating through the field oxide 262a, 262b and poly-load element 264 so that the N-well 260 is also formed under the aperture 240.

Figure 2H:
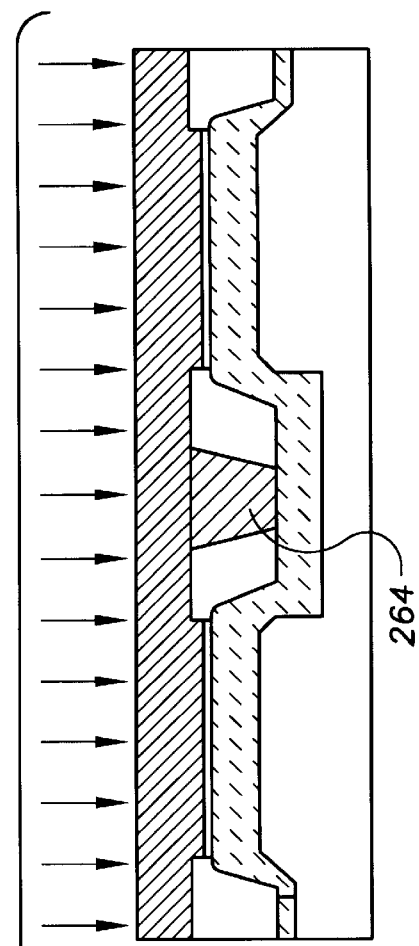

Next, as shown in FIG. 2h, P-wells of the CMOS structure are formed via boron implantation, and the STI poly-load element 264 is masked from the Boron species.

Figure 2I:
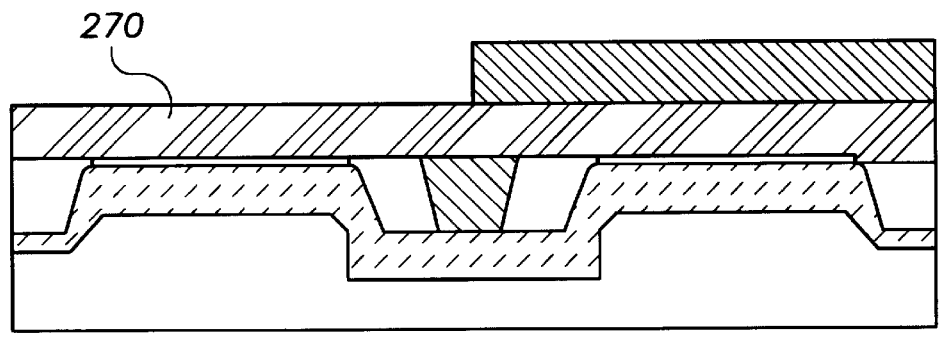
Figure 2J:
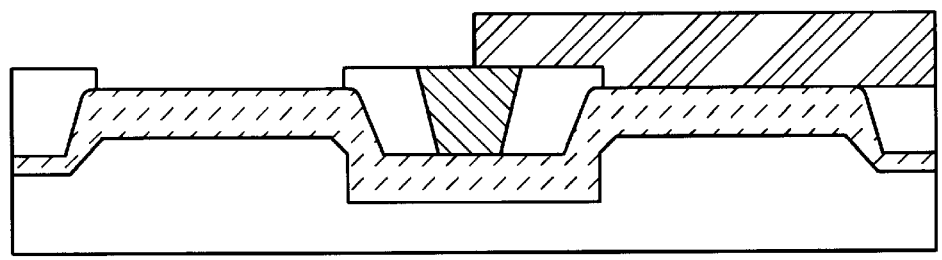

FIG. 2i shows the deposition and masking of the poly-silicon gate 270. After deposition, the poly-silicon gates are etched and the resulting structures are shown in FIG. 2j. Conventional CMOS process technology is used to form the remaining portions of the transistors.

Figure 2K:
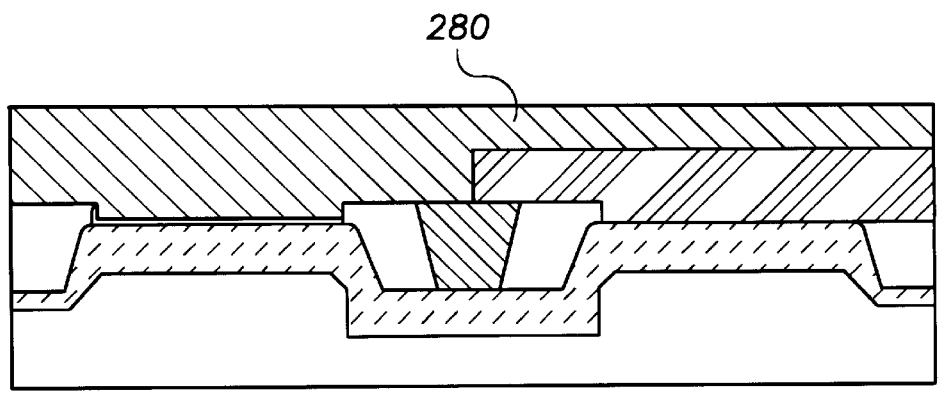

The remaining FIGS. 2k through 2m show application of an insulation layer (an IMO or inter-metal oxide) 280, and contact regions that are etched and filled with Tungsten to form plugs 290 for electrically connecting to the subsequent metal layer 300.

According to one specific example embodiment, the trench depth is in on the order of 0.3 micrometers. The dimensions and areas of the components, which comprise the overall structure, are comparable to those in a modern sub-micron process.

Figure 3A:
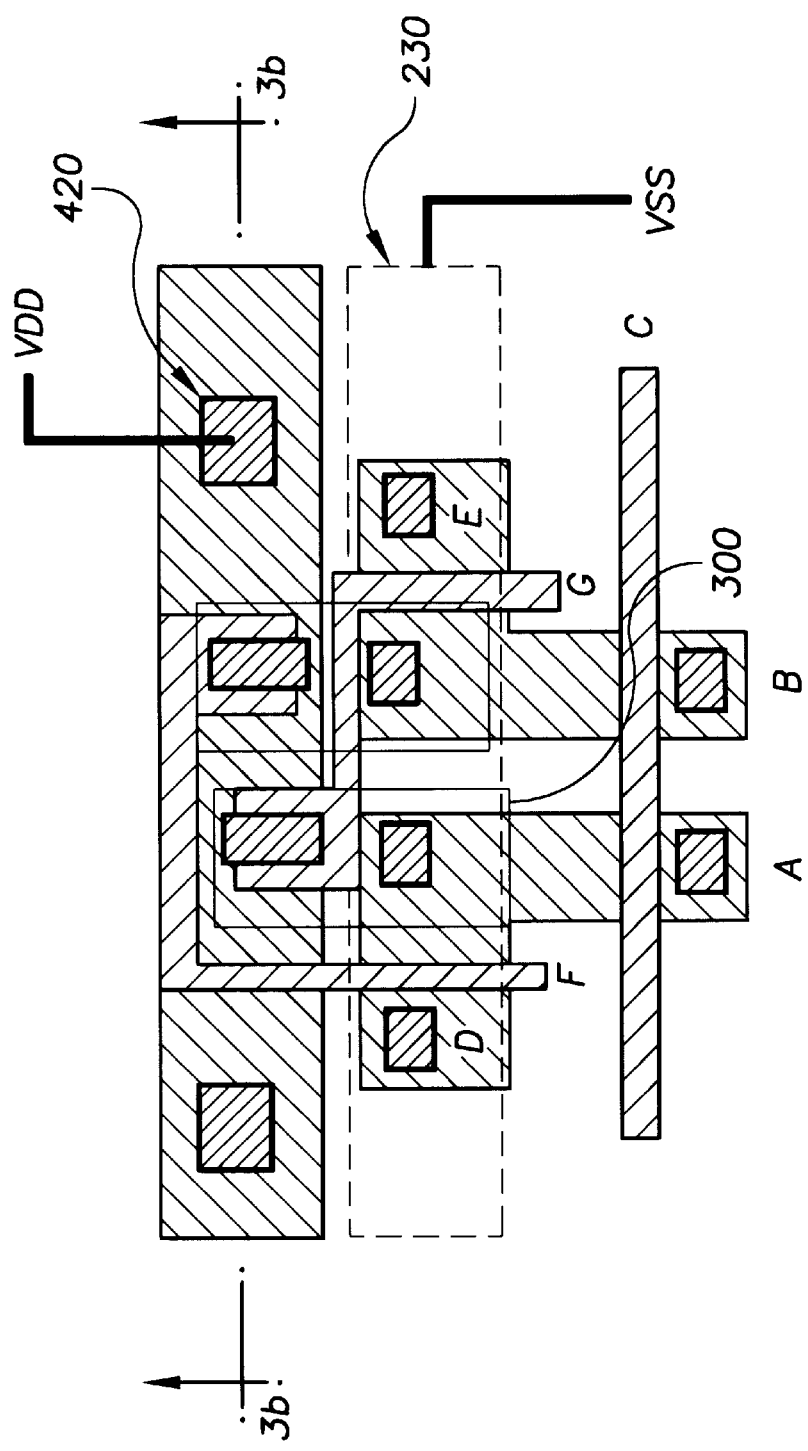
FIGS. 3a–3c respectively illustrate a top view, cross-sectional view, and a schematic view, of a particular example SRAM application, according to the present invention.
Figure 3B:
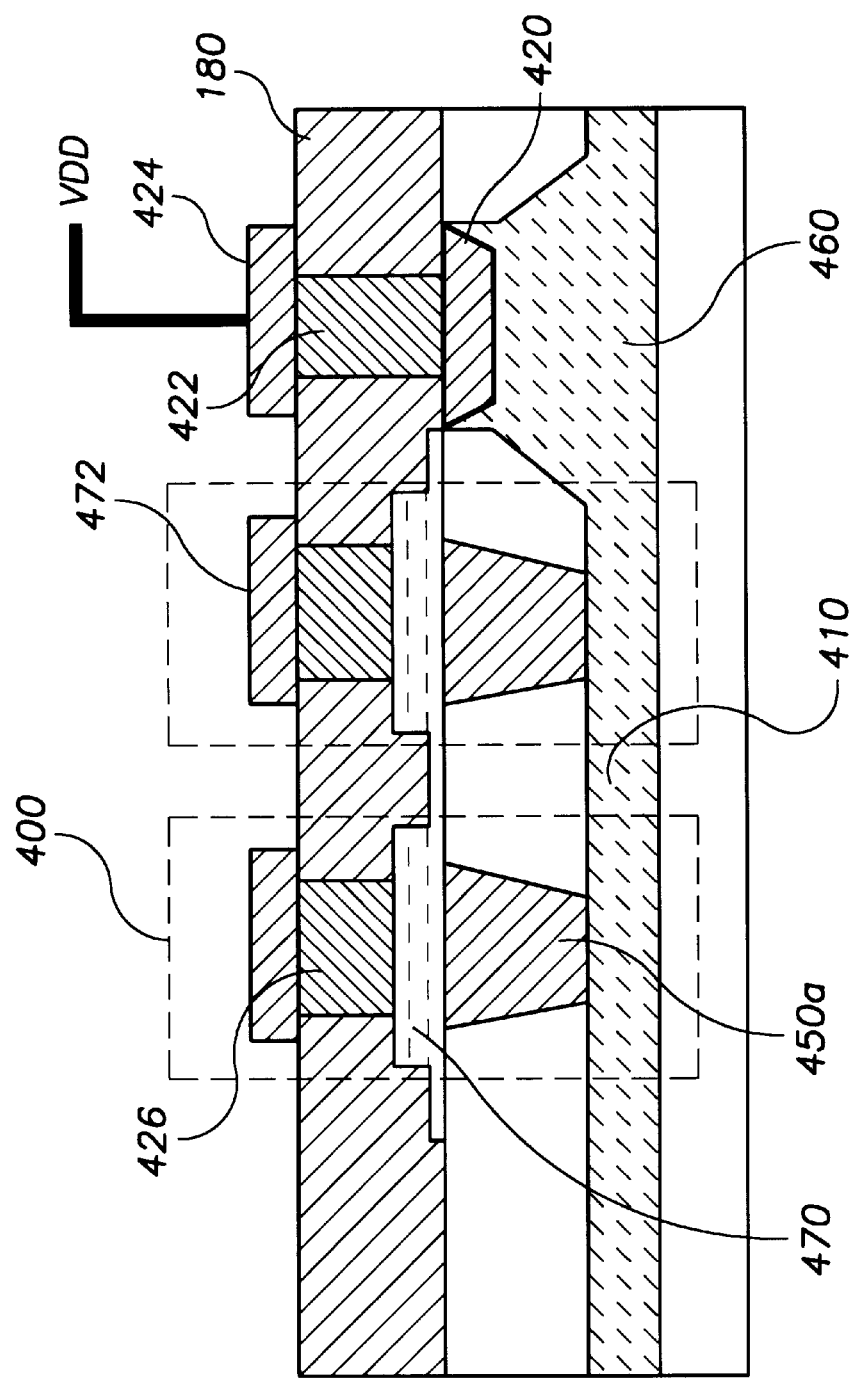
Figure 3C:
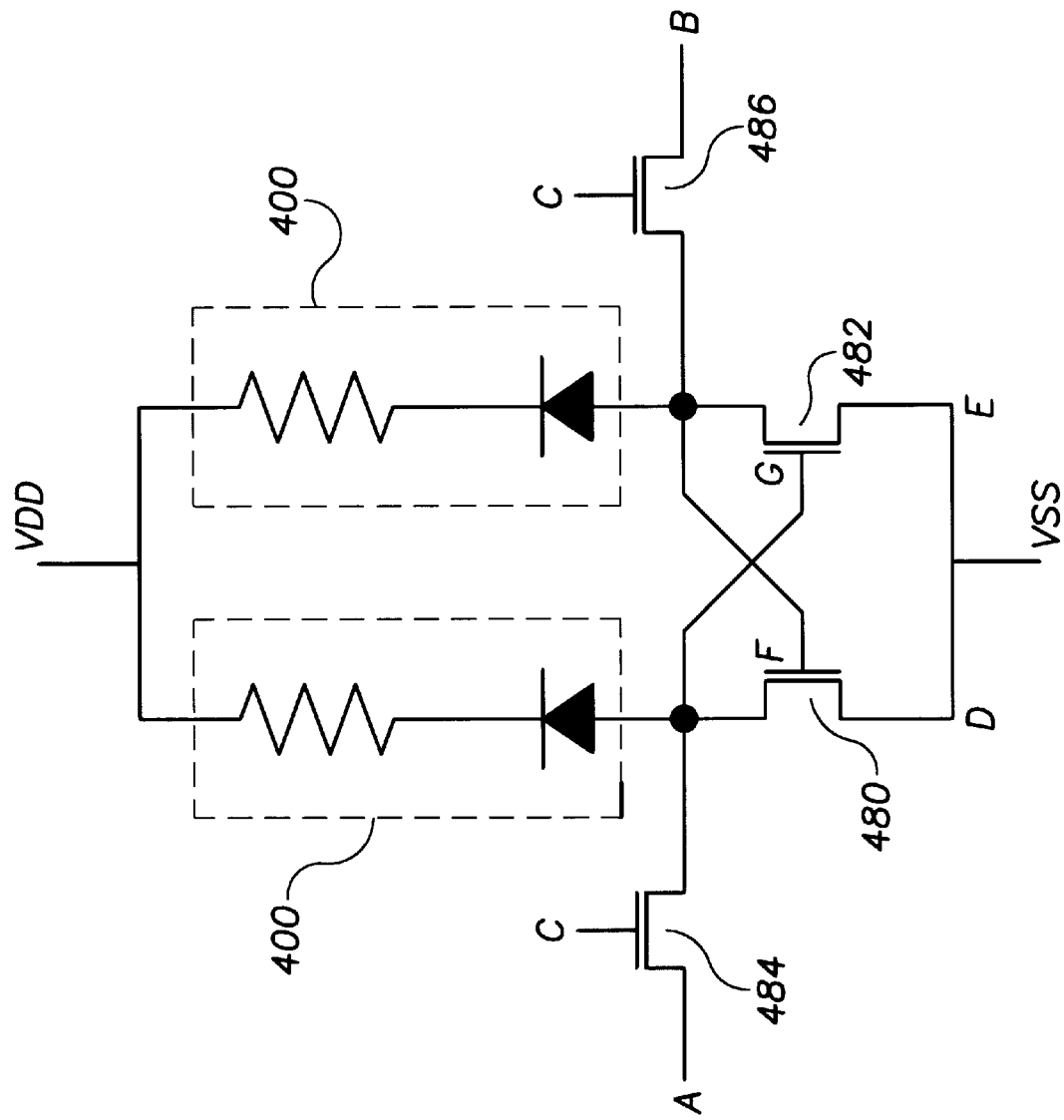

FIGS. 3a–3c depict the above-illustrated example embodiment as applied to a CMOS SRAM cell. FIG. 3a illustrates the example embodiment from the masking perspective, and FIG. 3b illustrates the corresponding cross-sectional view. FIG. 3c illustrates the example embodiment from a schematic perspective.

In FIGS. 3a and 3b, an n$^+$ region 420 is shown driven to a voltage VDD through a tungsten plug 422. The n$^+$ region 420 is resistive and this resistance is depicted by the resistors in each of the load circuits 400, as outlined by the dashed lines of FIG. 3c. Metallization is then applied to the tungsten plug at 220 and is shown as layer 424 coupled to VDD.

The VDD is set to the range appropriate for the particular process technology. For example, in a modern sub-micron process VDD can range from 1 to 5 volts. In one particular embodiment, the N-well length can range from a few microns to thousands of micrometers. In such a process, the width of the N-well can range from 1.0 micrometer to 3.0 micrometers, and the depth of the N-well can range from 0.2 micrometer to 0.5 micrometer. The sheet resistance of the N-well is on the order of 1000 to 3000 ohms per square.

As dictated by design requirements, any number of the load structures 400 (FIGS. 3b and 3c) can be formed within a single STI oxide region. In FIG. 3b, two p$^+$ poly-silicon plugs 450a have been formed within a common STI oxide region 410.

The load structure 400 includes a reverse-biased diode defined by the interface between the p+ poly-silicon (plug) 450a and the N-well 460. Poly-gate connections 470 provide electrical connections between the diode and the SRAM cell. Tungsten plugs 426 and metal regions 472 are formed to provide electrical connections to the poly-gates 470.

As shown in the SRAM cell of FIG. 3c, one load structure 400 is provided for each of two cross-coupled transistors 480 and 482. Transistors 484 and 486 are pass transistors. The load structure 400 can be viewed as replacing the conventional PMOS device as the pull-up element. Because the load structures have been formed in the isolation region, the 4T (four-transistor) SRAM cell of FIG. 3c can be implemented in a much smaller area than that of the conventional 6T CMOS SRAM.

The SRAM cell of FIG. 3c can be integrated using conventional array control/access techniques. In one particular embodiment, terminals A and B are coupled to bit lines, and terminals C are coupled to the word line through respective poly-silicon gates. Cross-coupled transistors 480 and 482 have source terminals D and E connected to VSS. These terminals are shown in both FIGS. 3a and 3c.

While the present invention has been described with reference to several particular example embodiments, those skilled in the art will recognize that many changes may be made thereto. For example, in each of the above-disclosed embodiments the polarity types of the various devices can be switched between negative and positive, and the various layers and devices can be altered to include other materials. Such changes do not depart from the spirit and scope of the present invention, which is set forth in the following claims.

What is claimed is:

1. A method of fabricating a semiconductor including a load device, comprising the steps of:
    providing a trench isolation (TI) structure of certain depth with an opening therein, an upper portion of the opening of the TI structure adjacent to a nitride stop layer;
    defining a poly-silicon load area in the TI structure and protruding above a portion of the TI structure;
    planarizing the poly-silicon load area until the poly-silicon load area is substantially flush with the adjacent TI structure;
    doping the poly-silicon load area with carriers of a first polarity type; and
    removing the nitride stop layer.

2. A method of fabricating, recited in claim 1, wherein the first polarity type is positive and the carriers includes boron.

3. A method of fabricating a series resistor and diode load device in an N-well on a P-type substrate comprising the steps of:
    creating an STI oxide substantially the depth of the N-well, having an opening therein, the STI structure surrounded by a nitride stop layer;
    defining a poly-silicon load area substantially contained within the STI oxide, the load area having a depth comparable to that of the STI oxide;
    performing a chemical-mechanical polishing of the poly-silicon load area until the poly-silicon load area is substantially flush with the surrounding STI oxide;
    removing the nitride stop layer; and
    doping the poly-silicon load area with positive polarity carriers until the poly-silicon becomes p+.

4. A method of fabricating a series resistor and diode load device in an P-well on a N-type substrate comprising the steps of:
    creating an STI oxide substantially the depth of the P-well, having an opening therein, the STI structure surrounded by a nitride stop layer;
    defining a poly-silicon load area substantially contained within the STI oxide, the load area having a depth comparable to that of the STI oxide;
    performing a chemical-mechanical polishing of the poly-silicon load area until the poly-silicon load area is substantially flush with the surrounding STI oxide;
    doping the poly-silicon load area with negative polarity carriers until the poly-silicon becomes n+; and
    removing the nitride stop layer.

5. A method of fabricating a load device as recited in claim 4 wherein the negative polarity carriers include at least one of the following:
    Phosphorus, Arsenic, and Antimony.

6. A method of integrating a load device into a shallow trench isolation (STI) oxide structure surrounded by an N-well, the N-well having a nitride stop layer deposited thereon leaving an opening in the STI structure and the nitride layer contacting and substantially flush with the STI structure, comprising the steps of:
    defining through photolithography, a load area having dimensions substantially contained within the STI oxide structure;
    etching a load area through the STI oxide structure to a depth adjacent the N-well;
    depositing poly-silicon into the load area substantially filling the load area to the height of the STI oxide structure;
    chemical-mechanical polishing the poly-silicon until it is flush with the surrounding STI oxidation;
    masking the STI oxide through photolithography and exposing the load area;
    nitride etching the nitride stop layer; and
    implanting boron into the poly-silicon through the exposed load area.

7. A method of fabricating a load device as recited in claim 1 wherein the load device is used as a pull-up element in an SRAM.

* * * * *